(12) United States Patent
Joe et al.

(10) Patent No.: US 6,799,940 B2
(45) Date of Patent: Oct. 5, 2004

(54) REMOVABLE SEMICONDUCTOR WAFER SUSCEPTOR

(75) Inventors: Raymond Joe, Austin, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 10/310,141

(22) Filed: Dec. 5, 2002

(65) Prior Publication Data

US 2004/0109748 A1 Jun. 10, 2004

(51) Int. Cl.$^7$ .............................................. B65G 49/07

(52) U.S. Cl. .......................... 414/937; 414/935; 901/30

(58) Field of Search ................................ 414/935, 936, 414/937, 941; 206/710, 711, 712, 832; 118/30, 31; 901/724, 728

(56) References Cited

U.S. PATENT DOCUMENTS

| | | |
|---|---|---|
| 4,950,870 A | 8/1990 | Mitsuhashi et al. |
| 5,162,047 A * | 11/1992 | Wada et al. ............... 29/25.01 |
| 5,310,339 A | 5/1994 | Ushikawa |
| 5,431,561 A | 7/1995 | Yamabe et al. |
| 5,458,688 A | 10/1995 | Watanabe |
| 5,492,229 A | 2/1996 | Tanaka et al. |
| 5,494,524 A | 2/1996 | Inaba et al. |
| 5,507,873 A | 4/1996 | Ishizuka et al. |
| 5,534,074 A | 7/1996 | Koons |
| 5,562,387 A | 10/1996 | Ishii et al. |
| 5,586,880 A | 12/1996 | Ohsawa |
| 5,618,351 A | 4/1997 | Koble, Jr. et al. |
| 5,626,456 A | 5/1997 | Nishi |
| 5,775,889 A | 7/1998 | Kobayashi et al. |
| 5,779,797 A | 7/1998 | Kitano |
| 5,810,538 A | 9/1998 | Ozawa et al. |
| 5,813,851 A | 9/1998 | Nakao |
| 5,820,366 A | 10/1998 | Lee |
| 5,820,367 A | 10/1998 | Osawa |
| 5,865,321 A | 2/1999 | Tomanovich |
| 5,897,311 A | 4/1999 | Nishi |
| 5,961,323 A | 10/1999 | Lee |
| 5,968,593 A | 10/1999 | Sakamoto et al. |
| 6,093,644 A | 7/2000 | Inaba et al. |
| 6,099,645 A | 8/2000 | Easley et al. |
| 6,190,113 B1 * | 2/2001 | Bui et al. .................... 414/672 |
| 6,293,749 B1 * | 9/2001 | Raaijmakers et al. ........ 414/609 |
| 6,344,387 B1 | 2/2002 | Hasebe et al. |

FOREIGN PATENT DOCUMENTS

| | | |
|---|---|---|
| EP | 0 843 338 | 5/1998 |
| JP | 8-330318 | 12/1906 |
| JP | 54-075985 | 6/1979 |
| JP | 06-151347 | 5/1994 |
| JP | 06-163440 | 6/1994 |
| JP | 6-168903 | 6/1994 |
| JP | 6-224146 | 8/1994 |
| JP | 6-260438 | 9/1994 |
| JP | 06-260438 | 9/1994 |
| JP | 07-045691 | 2/1995 |
| JP | 00477897/EP B1 | 6/1995 |
| JP | 07-263370 | 10/1995 |
| JP | 09-050967 | 2/1997 |
| JP | 09-092625 | 4/1997 |
| JP | 09-199437 | 7/1997 |
| JP | 09-199438 | 7/1997 |
| JP | 10-050626 | 2/1998 |

(List continued on next page.)

*Primary Examiner*—Khoi H. Tran
(74) *Attorney, Agent, or Firm*—Smith, Gambrell & Russell

(57) ABSTRACT

A removable semiconductor wafer susceptor used for supporting a substrate during batch processing. The susceptor includes a flat circular central plane with a predetermined outer diameter. The susceptor is sized to fit within an inner diameter formed from wafer support ledges of a wafer transport container. The susceptor includes edges that are chamfered and rounded to lessen stress concentration at the edges. The susceptor is transported through processing by a sieving action of transport automation.

58 Claims, 16 Drawing Sheets

FOREIGN PATENT DOCUMENTS

| | | |
|---|---|---|
| JP | 08-277297 | 4/1998 |
| JP | 10-242237 | 9/1998 |
| JP | 10-284429 | 10/1998 |
| JP | 11-16993 | 1/1999 |
| JP | 11-026561 | 1/1999 |
| JP | 09-197023 | 2/1999 |
| JP | 11-040659 | 2/1999 |
| JP | 11-054447 | 2/1999 |
| JP | 11-243064 | 9/1999 |
| JP | 2000-232151 | 8/2000 |
| WO | WO 00/19502 | 4/2000 |
| WO | WO 00/48244 | 8/2000 |

* cited by examiner

INDUSTRY STANDARD SUPPORT METHOD
(PRIOR ART)

RING SUPPORT METHOD(S)
(PRIOR ART)

BAND SUPPORT METHOD
(PRIOR ART)

OPTIMAL SUPPORT METHODS
(PRIOR ART)

(PRIOR ART)

NOTE: WHEN FORK GOES DOWN, DISK FALLS TRHOUGH AND REMAINS ON FORK.

NOTE: MINIMUM REQUIRED PITCH =
STD PITCH + 1/2 RING TICKNESS =
8 MM + 0.3 MM = 8.3 MM

NOTE: SMALL GAP PERMITS TIGHT PITCH TO BE USED

REMOVABLE SEMICONDUCTOR WAFER SUSCEPTOR

BACKGROUND OF THE INVENTION

This invention relates to semiconductor wafer processing, and more particularly to a removable semiconductor wafer susceptor which can be used in batch processing of semiconductor substrates.

For common semiconductor films such as silicon nitride, polysilicon, and thermal oxides, substrate processing usually proceeds by elevating the substrate to some process temperature, conducting the process, and finally cooling the substrate. Generally, most processes are conducted in a 200 mm batch furnace where substrates (hereafter referred to as wafers) are placed in a vertically stacked arrangement. Because of process and throughput requirements, the wafer stack often undergoes rapid heating and cooling at the beginning and end of the process. However, some thermal ramping limits exist at higher processing temperatures. It is now known that for 300 mm wafer, serious limitations exist on wafer heating/cooling rates and maximum process temperatures, well below the operational limits of the processing equipment.

The gravitational force and elevated process temperature (typically above 850° C.) cause considerable stress on the silica on wafer, leading to situations where slip and plastic deformation may occur. Fast thermal ramping can further degrade the situation because within-wafer (WinW) thermal gradients from uneven heating of wafers in a vertical stacked arrangement may cause slip to occur even before the process temperature is reached. Of course, fast thermal ramping is employed to increase productivity by decreasing the overall cycle time or reduce thermal budget by decreasing the ramping cycles. Therefore, a serious situation arises for high temperature processing of 300 mm substrate, especially in batch processing environments. Additionally, even if slip does not occur, the induced thermal gradient on the wafer may be of sufficient magnitude as to cause significant differences in the thermal histories of the die spread across the wafer. This will result in an unexpected die performance variation between the wafer center and edge locations.

Two approaches can be taken to solve this slip problem. One approach is to improve the wafer's chemical and mechanical characteristics, such as decreasing the oxygen precipitate concentration within the silicon wafer. This approach is an area of responsibility for the wafer manufacturers. The other approach is to improve the substrate susceptor(support) design.

The current industry standard for vertical batch wafer processing is the ladder boat and its variations (FIG. 1). The wafer boat is a holding device shaped like a hollow cylinder and is made of, for example quartz which has high heat resistance and high chemical stability. It comprises, for example, four vertical support rods, each having grooves. The wafer boat holds wafers, each set at its circumferential portion in the four grooves made in the four support rods. Hence, the wafers are held parallel to one another and one above another. This is the simplest design for vertical batch processing. However, it does not provide the most optimum mechanical support possible with respect to gravitational forces. Also, the standard ladder boat provides little reduction in thermal gradients. The ladder boat's greatest advantages are its low cost and compatibility with standard automation.

Two previously developed innovations have addressed the WinW wafer thermal issue for batch processing. The first wafer support method, shown in FIG. 2, was developed and patented by Tokyo Electron Ltd. (TEL). This "ring" support method uses a ring of material (typically quartz) designed to come into physical contact with the edge of the wafer. The addition of mass near or at the wafer's edge reduces the WinW thermal gradient because of the increase in heat capacity and change in radiation view factors. The method also provides a larger area of mechanical support than a ladder boat. The method gives good performance on 200 mm wafers, as thermal WinW gradients are controlled to under 10° C. for fast thermal ramps (above 75° C./min). However, this support method is complex and such designs are more expensive to manufacture and purchase. Additionally, this method requires more complex automation to load and unload wafers from the support appliance, leading to added cost for the associated support automation.

Another approach found in the prior art (previously patented by SVG, Thermco Systems) is the "band" method as shown in FIG. 3. Here, a thin band of material, typically quartz, is placed around the edge of the wafer, but not in intimate contact. The quartz material is either opaque or mechanically modified to be translucent. This method, like the ring support, reduces or screens incident radiation onto the wafer's edge, while permitting radiation through the unblocked areas and onto the wafer's center. Although not as effective as the ring support method shown in FIG. 2, the "band" method does reduce WinW thermal gradients and can be manufactured at a lower cost.

Other approaches to wafer support methodologies have been previously explored by others and are well known within the industry. In FIG. 4A, the best theoretical point contact support at a single radius value is shown. This method places point supports at 70% of the radial distance from the center to the wafer's edge, to balance the weight of the wafer on either side of the support and reduce gravitational stress effects. This approach when implemented in a ladder boat configuration will provide better support, but the cost will be greater due to the additional manufacturing complexity of very long support tabs. Also, this method does not address the WinW thermal gradient problem. A corresponding analogy exists for the ring support (point contact) where the location for a single ring would be also at 70% of the radial distance from the center to the wafer's edge. In this case, the ring support's axial symmetry greatly improves the control of the gravitational stress magnitude and symmetry compared to the ladder boat method. FIG. 4C shows the absolute best theoretical support design possible, as all pints on the wafer are mechanically supported. Clean, simple, and efficient mechanical wafer loading and unloading for this design becomes a serious problem, if not impossible, with current automation technology.

The vast majority of single wafer processing equipment currently use supports shown in FIGS. 4B and 4C. Here either a ring of material or a flat plate or susceptor composed of quartz, SiC or similar material supports the wafer. These design are preferred for reasons of simplicity or reduction of thermal mass to permit rapid wafer heating and cooing (up to 100° C./sec). The supports in FIGS. 4B and 4C are not necessarily employed for thermal WinW control in single wafer processing equipment because they rely on heating element design to accomplish WinW thermal uniformity. In some cases, there may be some benefit based on material selection with reducing thermal non-uniformity. As an added benefit, gravitational forces are reduced and in the case of FIG. 4C, are completely eliminated if the right support material is used. However, these designs do add complexity to the method of wafer handling and are best suited for single wafer environments where the automation comprises a larger percentage of the overall equipment set and cost.

WinW Thermal Gradients

The primary issue with batch processing and rapid heating of large substrates is the resultant thermal gradients, as demonstrated in FIG. 5. During the heating phase of the process cycle (see FIG. 5A), the edges of the wafer receive the majority of the incident radiation and as a result heat up at a faster rate. Heating of the interior regions of the wafer is chiefly accomplished by thermal conduction through the substrate itself. As a result, a "bowl"-shaped thermal profile forms across the wafer. This thermal gradient can add to the gravitational stress and—if large enough—cause warping, bowing, plastic deformation, and slip to occur. A solution to this problem would be to increase the pitch of the wafer stack, thereby increasing the radiation view factor for the wafer center.

As in the case for heating, rapid cooling of the wafer (see FIG. 5B) can also have negative effects. Efficient radiative cooling of the wafer's edge occurs because of a large exposed area (large angular exposure to the heater walls) at the wafer's edge. The interior regions of the wafer have smaller exposed angular area to the outside and thus cool inefficiently through radiation. The central region of the wafer mainly cools through thermal conduction from the wafer center to the edge where then energy is more effectively radiated away. As a result, a "dome"-like thermal gradient is formed across the wafer. This thermal gradient can add to the gravitational stress and—if large enough—cause warping, bowing, plastic deformation, and slip to occur. Like heating, a solution would be to increase the radiation view factor for the wafer center.

Given a particular support design, the magnitude of this WinW thermal gradient coupled with the process temperature determines whether slip conditions exist. FIG. 6 shows the difference in slip curves between a ladder-type and a ring boat. For a given WinW thermal gradient and process temperature, the wafer will tend to exhibit slip if the process condition lies on the right-hand side of the slip curve. FIG. 6 shows that the maximum allowable delta T decreases rapidly with increasing wafer edge temperature.

As seen in FIG. 7, the ladder boat (3 point support) would not be sufficient for processes requiring temperatures above 850° C., as slip and possible plastic deformation would occur. Increasing the number of point supports for a ladder boat or decreasing the oxygen precipitate concentration would help. Increasing the number of point supports and relocating them to the optimum locations would shift the slip curve to the right and permit a larger allowable WinW thermal gradient the processing temperature. The disk and ring supports lie near the limit for such improvements. The ring boat (ring support) would be adequate for the high temperature processes, but the complexity of wafer automation would be a disadvantage.

SUMMARY OF THE INVENTION

The present invention relates to a removable substrate susceptor. In FIG. 8, the susceptor ("Drop-Through Disk") provides a (substrate) support design that is generally flat and makes contact with the majority of the substrate (herein referred to as wafer) as to eliminate the gravitational stress component, such as a disk (FIG. 9), ring (FIGS. 10 and 11), or plate. A support is designed to be removable from the boat with industry automation technology. The desired support is composed of a material or composite with a higher thermal conductivity and stronger mechanical strength than Si, such as SiC, and be compatible with the chemistry and gas(es) present in the process chamber. The support is thin in cross section so that it adds minimal mass to the thermal load while thick enough to provide adequate mechanical support. The support's exact thickness can be determined experimentally so that it eliminates slip at the desired processing conditions. Theoretical calculations with MacWafer© suggests that the thickness for a SiC support should be between 1 to 2 wafer thicknesses (~750–1500 microns). The wafer contact side of the support should be processed flat but have a rough texture to avoid stiction and wafer drift movements.

The wafer support itself is further supported by the support members (tabs/fingers) 33 of a larger substrate support assembly 16, such as a ladder boat. The design of the larger substrate support assembly 16 (hereafter called a boat) can be varied with the only requirement is that it has support members 33 extending long enough towards the wafer center to make contact and establish adequate mechanical support with he wafer support. For example, in FIG. 9, the assembly can resemble a conventional ladder boat but with longer fingers. The simplest boat design is to be a 3-rail type with 120 degree spacing between rails. This ensures the best weight distribution of the wafer/support combination onto the boat. To maintain ring alignment, a third recess 31 (small recesses) are cut into the support members 33 or small tilt on fingers (not shown) are designed for wafer support contact point at the ~100 mm radial point.

Likewise, proper wafer and support alignment can be maintained while they are on the end-effector (wafer transfer mechanism) by designing the end-effector to have 2 different sized chamfered recesses or "trenches" (FIG. 12). When placed onto the end-effector, the support slides into the deepest (and smallest) second recess 19 while the wafer 12 sits on the upper, first recess 17.

BRIEF DESCRIPTION OF THE DRAWINGS

The various advantages of the present invention will become apparent to one skilled in the art by reading the following specification and subjoined claims and by referencing the following drawings in which:

DETAILED DESCRIPTION OF THE INVENTION

Figure 1A:
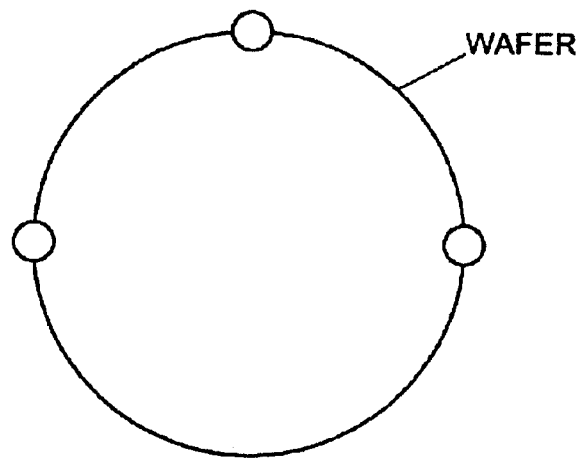
FIG. 1 is an industry standard for wafer support, the three rail vertical ladder boat, (A) cross-section showing the effect of gravity, (B) top view, and (C) vertical stack arrangement.
Figure 1B:
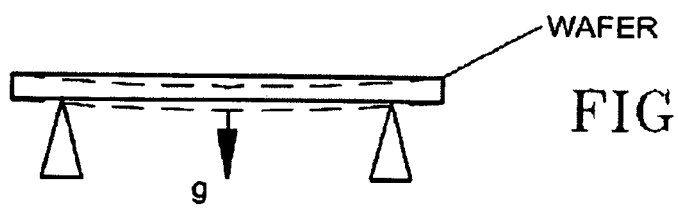
Figure 1C:
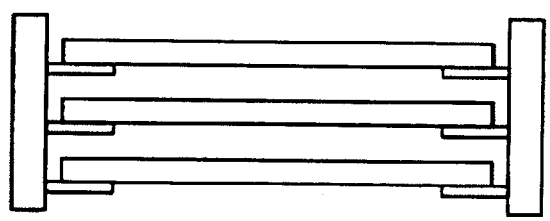
Figure 2B:
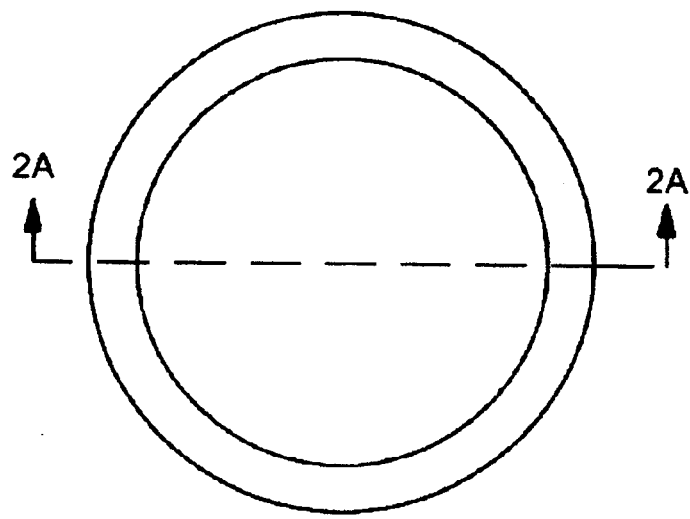
FIG. 2 is a ring boat: a ring supports the wafer along and near the wafer's edge, (A) cross-section, (B) top view, and (C) vertical stack arrangement.
Figure 2A:
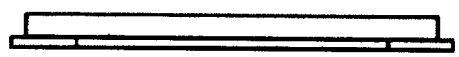
Figure 2C:
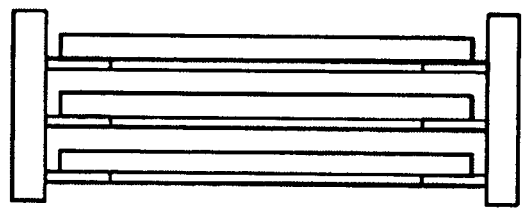
Figure 3B:
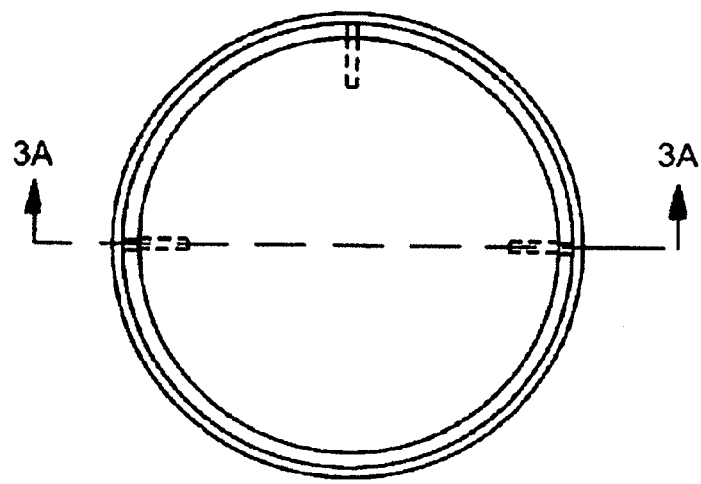
FIG. 3 is a band support design which places an opaque quartz band near the wafer's edge, (A) cross section, (B) top view, and (C) vertical stack arrangement.
Figure 3A:
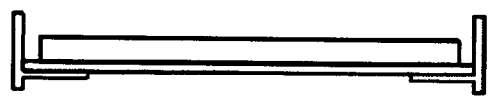
Figure 3C:
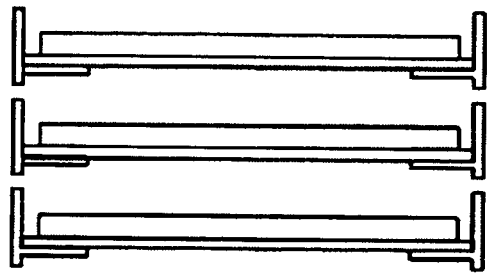
Figure 4B:
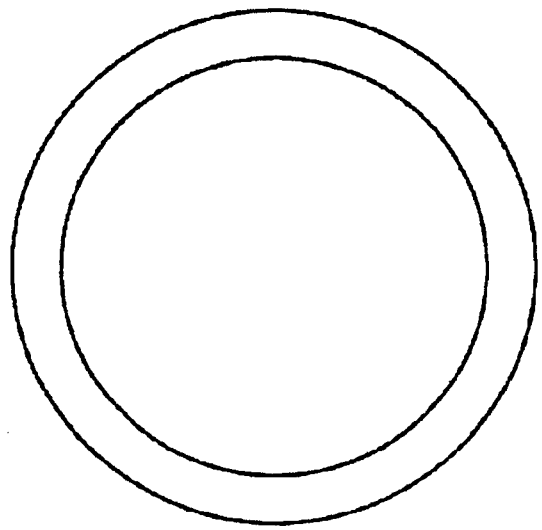
FIG. 4 is an optimal support design, (A) best support method, (B) support ring used on some single wafer systems, (C) flat susceptor design used on some single wafer systems.
Figure 4A:
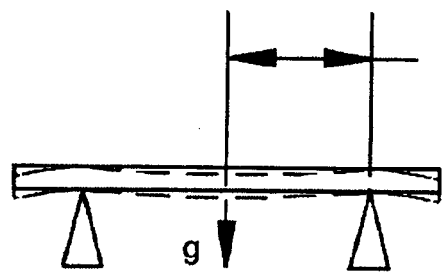
Figure 4C:
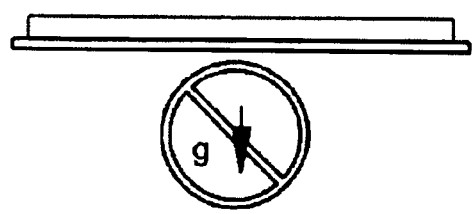
Figure 5A:
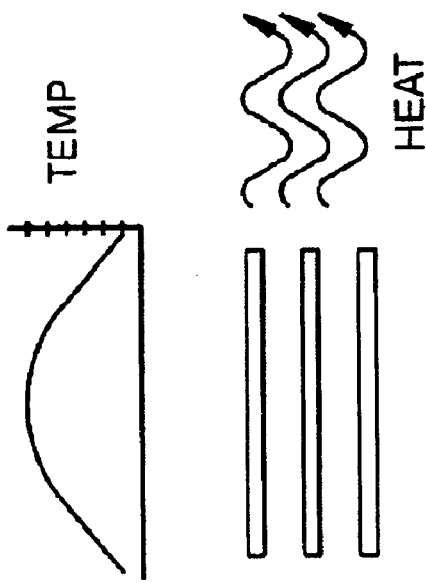
FIG. 5 is an illustration of the within-wafer thermal gradients during heating and cooling of the substrates, (A) heat up step, (B) cool down step.
Figure 5B:
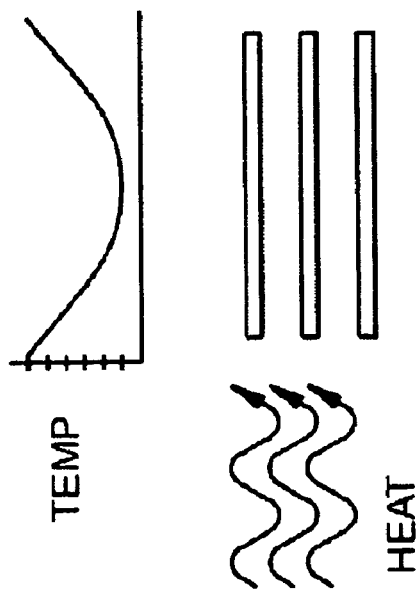
Figure 6:
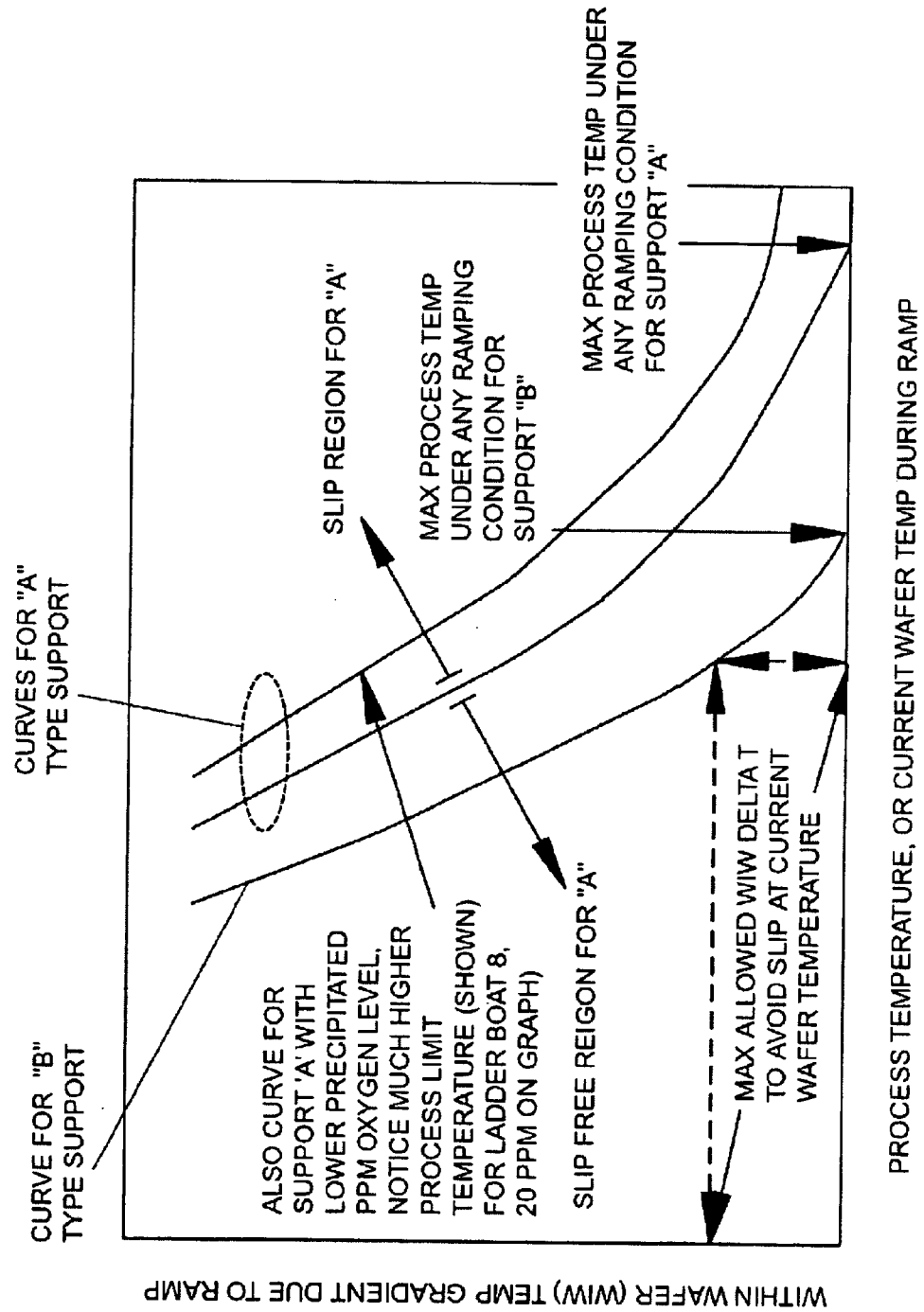
FIG. 6 illustrates slip curves for ladder-type boat (3 point support) and ring boat (point contact support)
Figure 7:
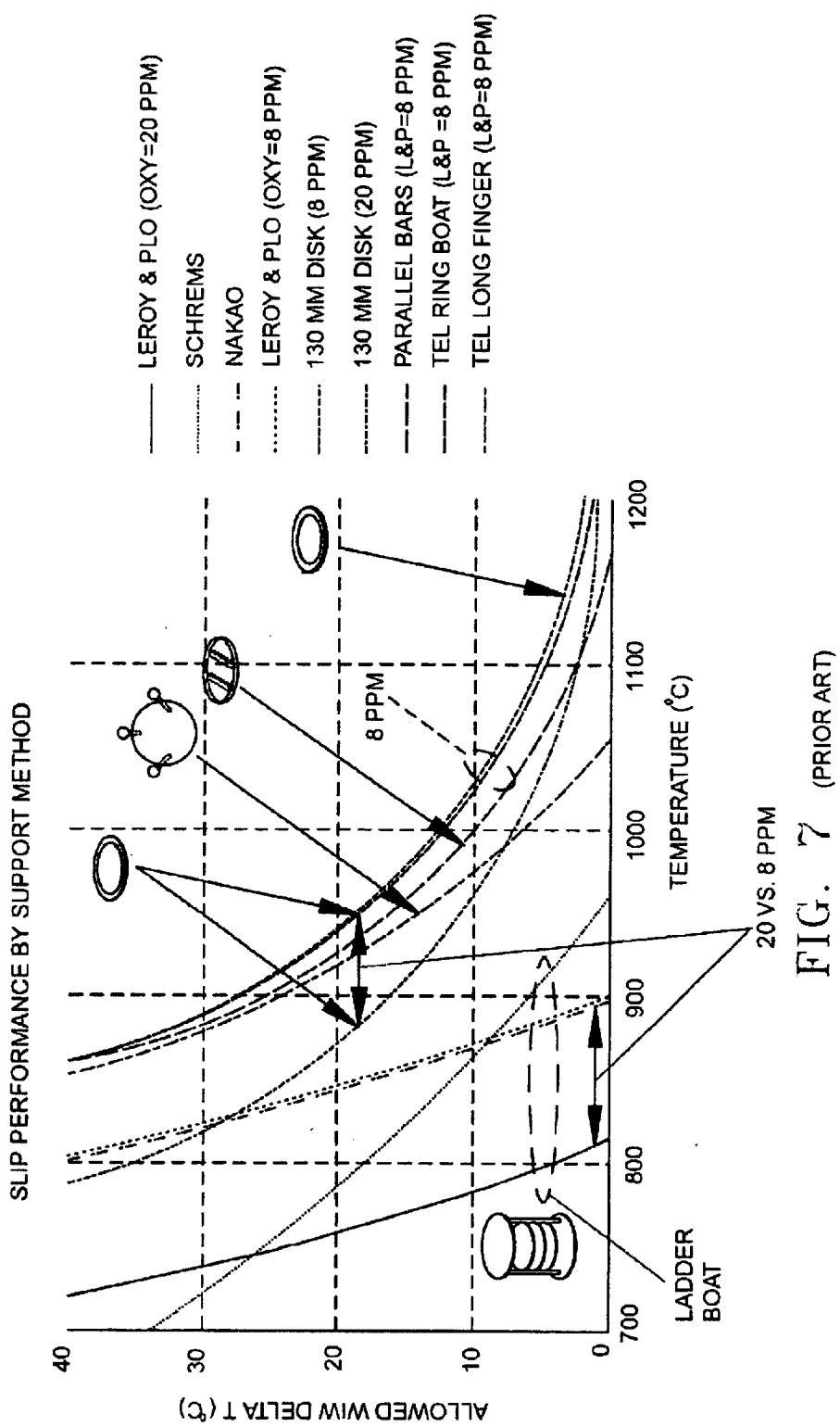
FIG. 7 is a slip performance by support method chart.
Figure 8B:
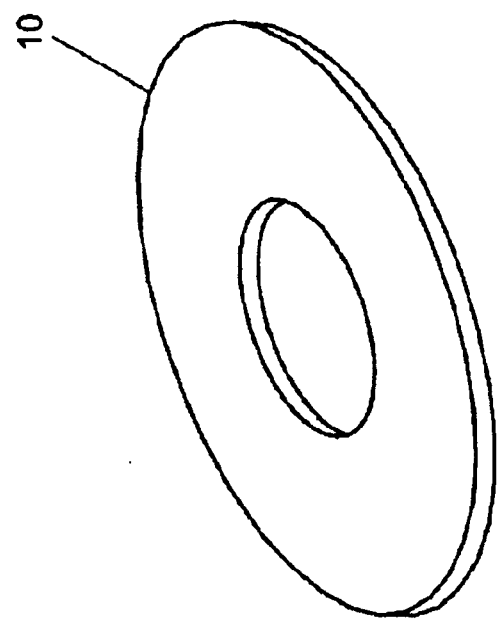
FIG. 8 is an embodiment of the claimed invention mounted in a boat, (A) cross-sectional view, (B) perspective view.
Figure 8A:
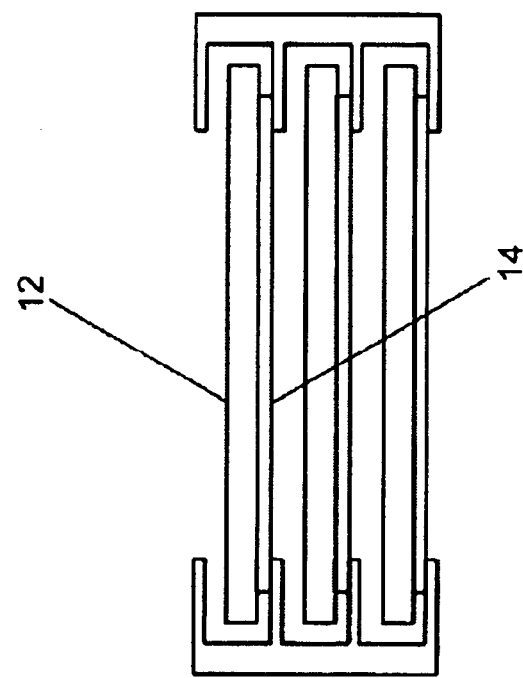
Figure 9A:
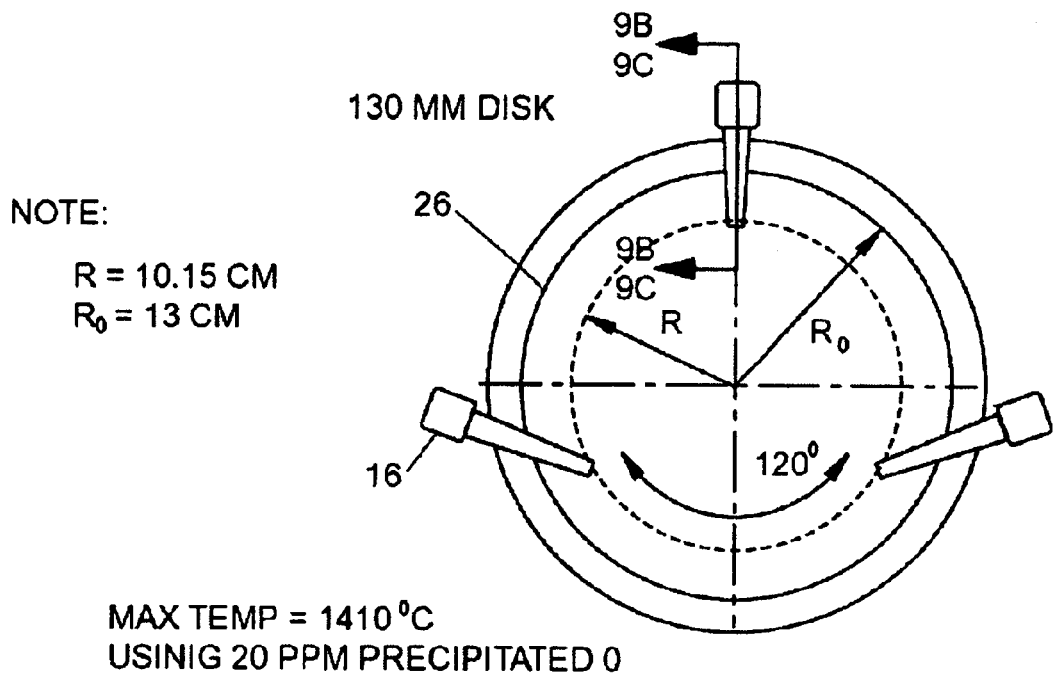
FIG. 9 is an embodiment of the claimed invention-(disk/ring version), (A) top view, (B) feature 16 'offset', (C) feature 16 'pocket'.
Figure 9B:
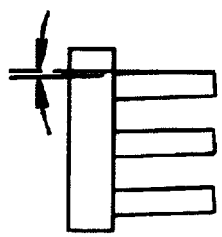
Figure 9C:
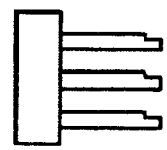
Figure 10A:
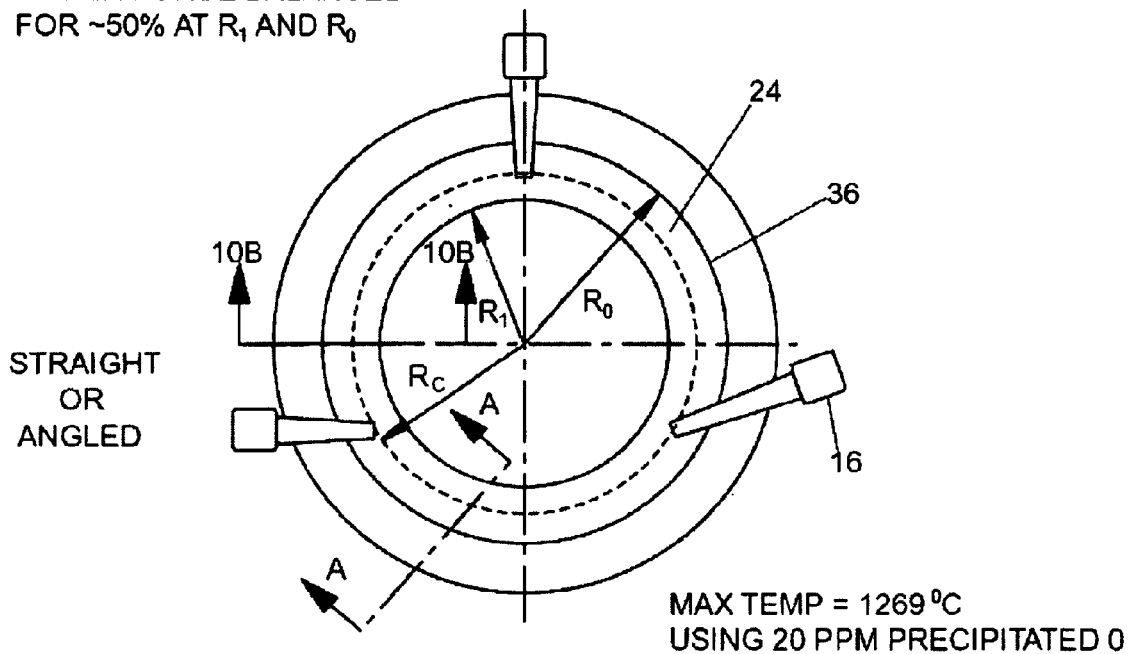
FIG. 10 is a detailed top view of an embodiment of the claimed invention-(annular disk/ring version), (A) top view, (B) segment cross-section.
Figure 10B:
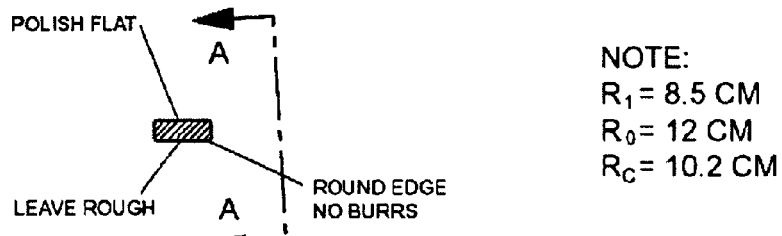
Figure 11:
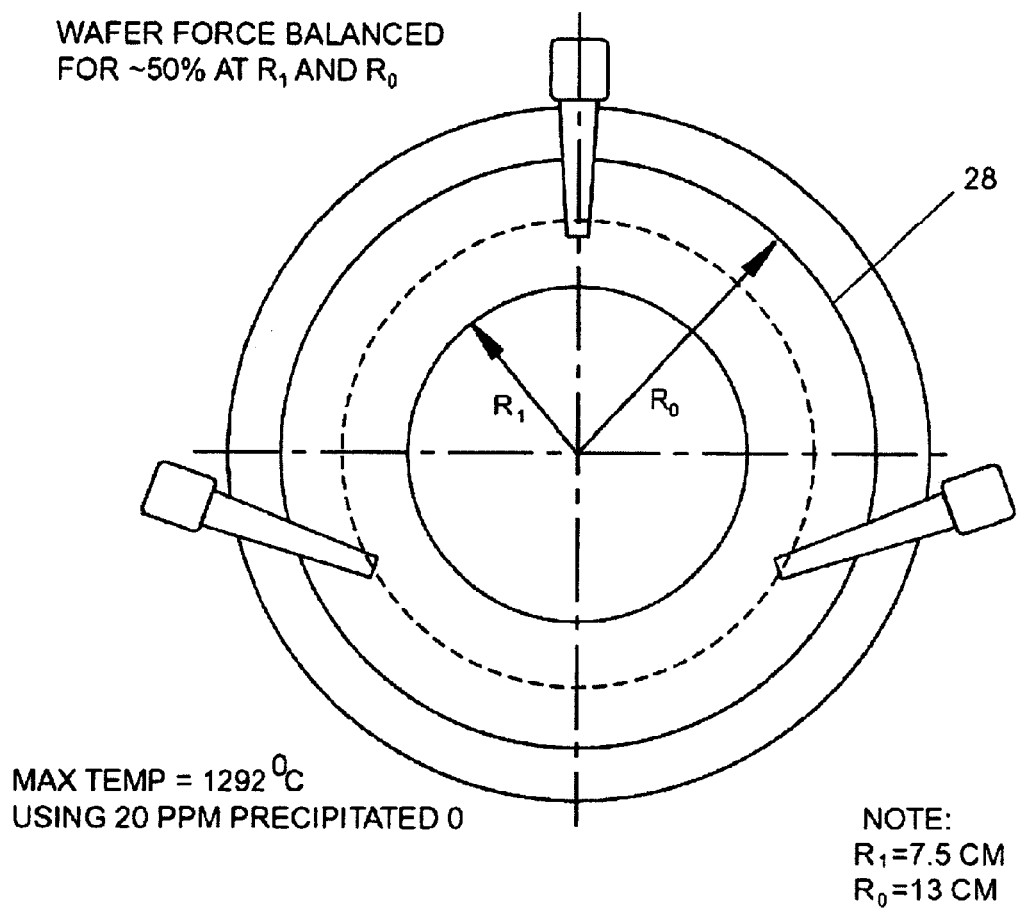
FIG. 11 is a detailed top view of a modified ring version of the claimed invention.
Figure 12A:
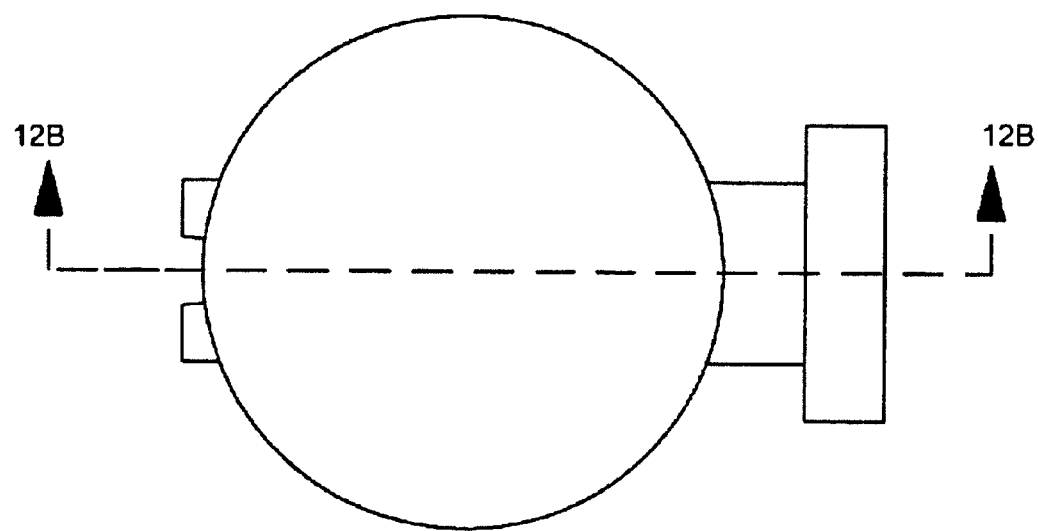
FIG. 12 is a version of an end-effector(fork) to align wafer and susceptor, (A) top view, (B) cross-sectional view, (C) detailed cross-section.
Figure 12B:
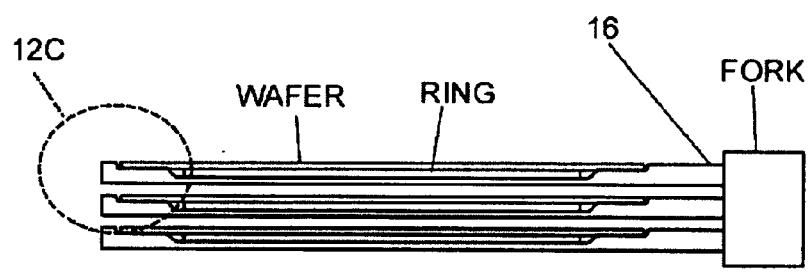
Figure 12C:
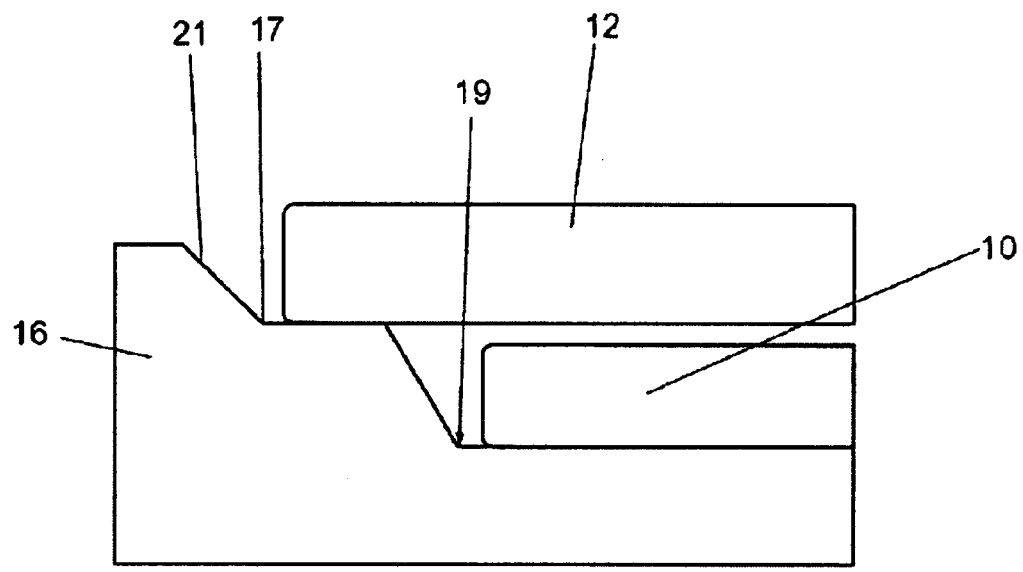
Figure 13A:
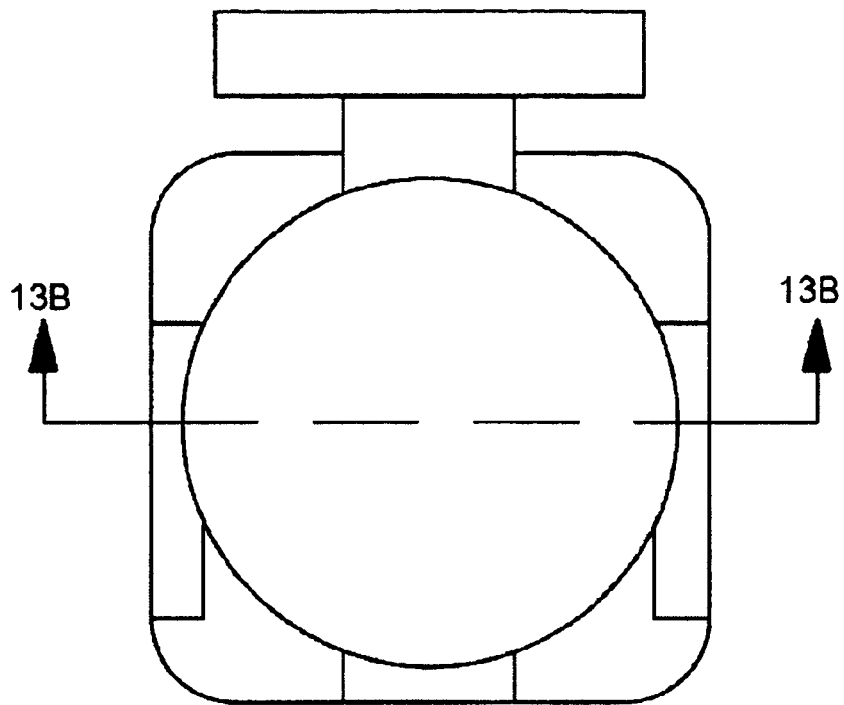
FIG. 13 is an end-effector operation at FOUP, (A) top view, (B) cross-sectional view.
Figure 13B:
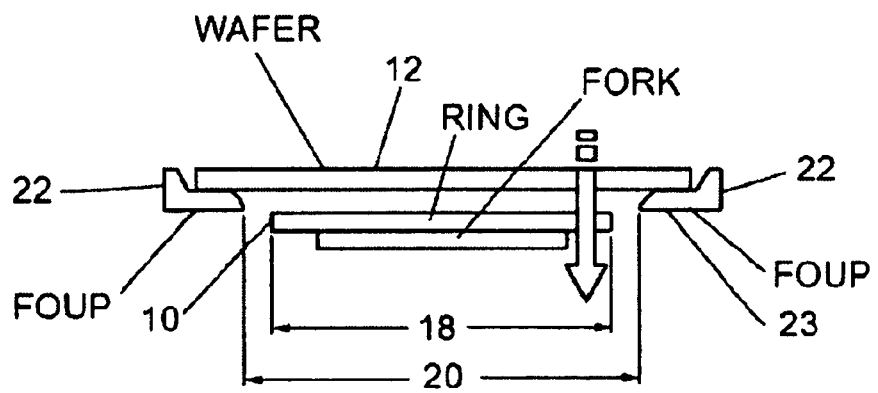
Figure 14A:
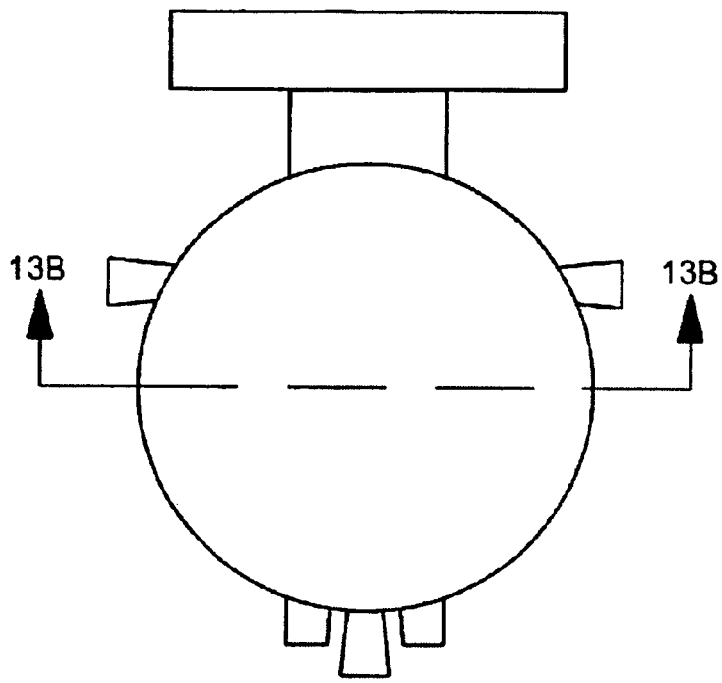
FIG. 14 is an end-effector operation at boat, (A) top view, (B) cross-sectional view.
Figure 14B:
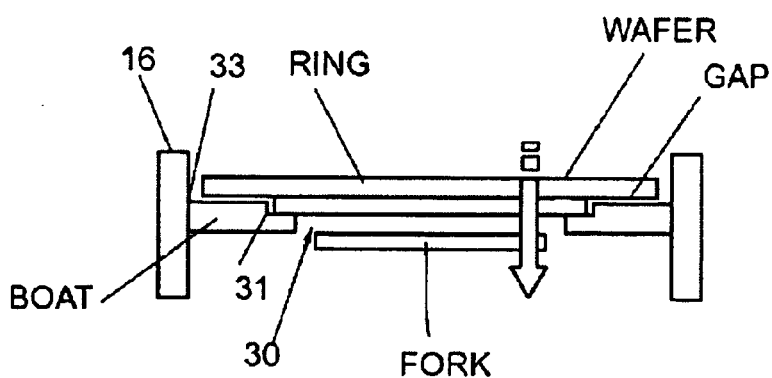

The substrate susceptor 10 is a flat disk 26 or ring 24 having an outer radial diameter 18 smaller than the silicon wafer (substrate) 12. The outer diameter 18 of the susceptor 10 is predetermined and sized to fit within the inner diameter 20 formed by the susceptor support ledges 23 of a susceptor transport container (22). This critical dimensional aspect of the support allows the drop-through concept to work within the furnace environment. The edges 36 of the susceptor 10 are chamfered or rounded to lessen the stress concentration at the edges 36 as illustrated in FIG. 10. FIGS. 13 and 14 show in detail how the "drop-through" concept works when the substrate 12 and susceptor 10 have 2 different radial dimensions. Shown in FIG. 13, the substrate transport container 22 (with ledges 23) that normally support substrates can be employed to separate and support, through the imaginary horizontal plane of the ledge. The substrate's diameter 18 prevents it from dropping through the plane, while the support's dimension allows it to pass through and remain on the self-aligning end-effector 21. This action "unloads" the substrate from the self-aligning end-effecotr 21. Combining the substrate with the susceptor ("loading" the substrate) is done in the opposite order. This "sieving" action is not only restricted to standard wafer transport containers. Any structure that contains ledges 23 similar to those in the wafer transport container 22 can serve the same "sieving" purpose. FIG. 14 shows how the substrate 12 and susceptor 10 are "loaded" onto the boat. Employing long support members 33 (fingers) on the boat that extends toward the center, these fingers are able to "catch" both substrate 12 and susceptor 10 (but not the end-effector 21) as the end effector 21 passes down through the imaginary horizontal plane of the boat fingers. Recesses (third recess 31) on the fingers allow proper alignment of the susceptor 10 and substrate 12. "Unloading" the substrate 12 and susceptor 10 from the boat is done in the opposite order.

Figure 15:
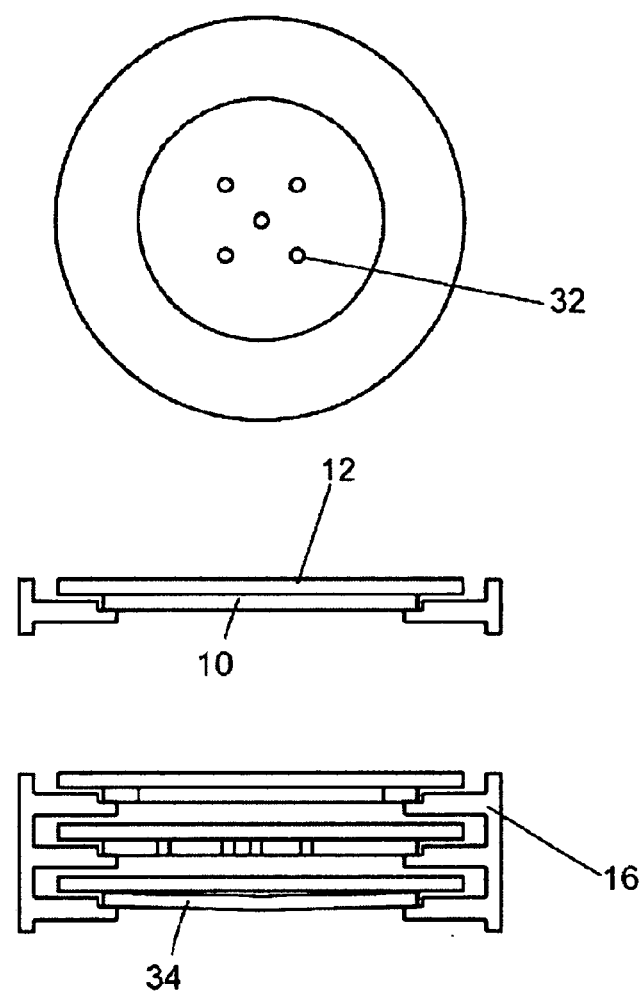
FIG. 15 is embodiments of the claimed invention, a) flat disk/ring, b) disk with holes, and c) side view of a, b, and concave-disk in a boat.

FIG. 15 shows the procedure by which the loading and unloading operations are done to accomplish thermal processing of the substrates. Since support disks/rings are separable from the boat, the susceptors can be loaded (and unloaded) separately from the product substrates into the furnace system.

Additional Considerations

Optimal performance of the susceptor may depend on additional modifications to the basic design. These are illustrated in FIG. 16. The basic design is shown for reference in FIG. 16A. Susceptor modification may involve surface modification of the bottom disc face through the use of a plurality of surface abstractions such as dimples 30, keys, or notches inscribed on the surface to facilitate alignment with the wafer transport container 22. The top surface may not be geometrically flat but finished to some shape to accommodate any bowing, warping, or non-flat shape of the wafer's backside such as a concave plane 34. This is done to permit physical contact between the wafer and the support under actual processing conditions.

The solid disk 26 provides the best mechanical support. However, it may not provide the ideal thermal mass distribution under thermal ramping conditions. In those cases, the annular disk/ring 28 offers better performance. Additionally, loading the substrate 12 onto the solid disk 26 may lead to undesired effects if a compressed gas layer is allowed to form in the narrow gap between the wafer and the support. If this condition were to occur, the substrate 12 may drift from the desired placement position while floating on the thin blanket of gas. Similarly, during the substrate 12 unloading operation within the wafer transport container 22, resistance to separation is possible if good intimate contact exists between the substrate 12 and susceptor. In this case, difficulty in lifting the substrate will occur as a partial vacuum (stiction) will exist between the substrate and the susceptor. To minimize these pressure effects, it is possible to incorporate a series of small holes or perforations 32 throughout the susceptor 10 that will permit gas pressure to equalize between the support underside and the gap 35 between the wafer and support (FIGS. 15B and 15C).

The invention has been described with reference to an exemplary embodiment. This description is for the sake of example only, and the scope and spirit of the invention ought to be construed by appropriate interpretation of the appended claims.

What is claimed is:

1. A semiconductor substrate transfer system used in substrate thermal processing, comprising:
    a self-aligning substrate transport container which stores at least one substrate;
    a removable semiconductor substrate susceptor for supporting the substrate during thermal processing;
    a self-aligning end-effector for transferring the substrate from said transport container to thermal processing along with said removable susceptor, wherein the substrate is oriented vertically above said removable susceptor; and
    a self-aligning substrate support assembly for supporting both said removable susceptor and the substrate in a vertical orientation during thermal processing.

2. The semiconductor substrate transfer system according to claim 1, wherein said removable susceptor comprises:
    a flat circular central plane mechanically separable from said self-aligning substrate support assembly, and including a predetermined outer diameter sized to fit within an inner diameter formed from wafer support ledges of said substrate transport container, wherein said flat circular central plane is a disk, a ring, a plate, or combination thereof.

3. The semiconductor substrate transfer system according to claim 2, wherein said removable susceptor includes a ring.

4. The semiconductor substrate transfer system according to claim 2, wherein said removable susceptor is a disk.

5. The semiconductor substrate transfer system according to claim 2, wherein said removable susceptor is an annular ring.

6. The semiconductor substrate transfer system according to claim 2, wherein said removable susceptor is silicon carbide, quartz, silicon, graphite, diamond-coated graphite, or silicon-coated graphite.

7. The semiconductor substrate transfer system according to claim 2, wherein said removable susceptor is composed of ceramics having net composite thermal conductivity at least equal to the substrate placed on top.

8. The semiconductor substrate transfer system according to claim 2, wherein said removable susceptor is composed of metals having net composite thermal conductivity at least equal to the substrate placed on top.

9. The semiconductor substrate transfer system according to claim 2, wherein said removable susceptor is composed of composites having net composite thermal conductivity at least equal to the substrate placed on top.

10. The semiconductor substrate transfer system according to claim 6, wherein said removable susceptor has a net mechanical strength at least equal to said substrate placed on top.

11. The semiconductor substrate transfer system according to claim 7, wherein said removable susceptor has a net mechanical strength at least equal to said substrate placed on top.

12. The semiconductor substrate transfer system according to claim 8, wherein said removable susceptor has a net mechanical strength at least equal to said substrate placed on top.

13. The semiconductor substrate transfer system according to claim 9, wherein said removable susceptor has a net composite mechanical strength at least equal to said substrate placed on top.

14. The semiconductor substrate transfer system according to claim 2, wherein said circular central plane includes a plurality of surface abstractions inscribed on a bottom of said removable susceptor to facilitate alignment.

15. The semiconductor substrate transfer system according to claim 14, wherein said plurality of structural abstractions includes dimples.

16. The semiconductor substrate transfer system according to claim 2, wherein said circular central plane includes perforations.

17. The semiconductor substrate transfer system according to claim 2, wherein said circular central plane is concave.

18. The semiconductor substrate transfer system according to claim 2, wherein said circular central plane is convex.

19. The semiconductor substrate transfer system according to claim 3 with chamfered, removable susceptor edges.

20. The semiconductor substrate transfer system according to claim 3 with rounded, removable susceptor edges.

21. The semiconductor substrate transfer system according to claim 4 with chamfered, removable susceptor edges.

22. The semiconductor substrate transfer system according to claim 4 with rounded, removable susceptor edges.

23. The semiconductor substrate transfer system according to claim 5 with chamfered, removable susceptor edges.

24. The semiconductor substrate transfer system according to claim 5 with rounded, removable susceptor edges.

25. The semiconductor substrate transfer system according to claim 17 with chamfered, removable susceptor edges.

26. The semiconductor substrate transfer system according to claim 17 with rounded, removable susceptor edges.

27. The semiconductor substrate transfer system according to claim 18 with chamfered, removable susceptor edges.

28. The semiconductor substrate transfer system according to claim 18 with rounded, removable susceptor edges.

29. A semiconductor substrate transfer system used in substrate thermal processing, comprising:
   a self-aligning substrate transport container which stores at least one substrate;
   a removable semiconductor substrate susceptor for supporting the substrate during thermal processing, wherein said removable susceptor comprises a flat circular central plane mechanically separable from a self-aligning substrate support assembly, and including a predetermined outer diameter sized to fit within an inner diameter formed from wafer support ledges of said substrate transport container;
   a self-aligning end-effector for transferring the substrate from said transport container to thermal processing along with said removable susceptor, wherein the substrate is oriented vertically above said removable susceptor; and
   a self-aligning substrate support assembly for supporting both said removable susceptor and the substrate in a vertical orientation during thermal processing.

30. The semiconductor substrate transfer system according to claim 29, wherein said support ledges of said self-aligning substrate transport container are sized to include the inner diameter larger than the outer diameter of said substrate susceptor to aid in alignment of the substrate when positioned.

31. The semiconductor substrate transfer system according to claim 30, wherein a plurality of support ledges are employed to position a plurality of substrates within said self-aligning substrate transport container.

32. A semiconductor substrate transfer system used in substrate thermal processing, comprising:
   a self-aligning substrate transport container which stores at least one substrate, wherein said support ledges of said self-aligning substrate transport container are sized to include an inner diameter larger than an outer diameter of a substrate susceptor to aid in alignment of a substrate when positioned;
   a removable semiconductor substrate susceptor for supporting the substrate during thermal processing, wherein said removable susceptor comprises a flat circular central plane mechanically separable from a self-aligning substrate support assembly, and including a predetermined outer diameter sized to fit within an inner diameter formed from wafer support ledges of said substrate transport container;
   a self-aligning end-effector for transferring the substrate from said transport container to thermal processing along with said removable susceptor, wherein the substrate is oriented vertically above said removable susceptor; and
   a self-aligning substrate support assembly for supporting both said removable susceptor and the substrate in a vertical orientation during thermal processing.

33. The semiconductor substrate transfer system according to claim 32, wherein said self-aligning end-effector aligns the substrate and said substrate susceptor along a common central axis by utilizing a difference in outer radial dimension between the substrate and said substrate susceptor.

34. The semiconductor substrate transfer system according to claim 33, wherein said self-aligning end-effector vertically supports the substrate on top of said substrate susceptor by employing two different sized recesses.

35. The semiconductor substrate transfer system according to claim 34, wherein said two different sized recesses are chamfered.

36. The semiconductor substrate transfer system according to claim 34, wherein said two different sized recesses structurally separate the substrate and said substrate susceptor vertically by a predetermined vertical dimension.

37. A semiconductor substrate transfer system used in substrate thermal processing, comprising:

a self-aligning substrate transport container which stores at least one substrate, wherein said support ledges of said self-aligning substrate transport container are sized to include an inner diameter larger than an outer diameter of a substrate susceptor to aid in alignment of a substrate when positioned;

a removable semiconductor substrate susceptor for supporting the substrate during thermal processing, wherein said removable susceptor comprises a flat circular central plane mechanically separable from a self-aligning substrate support assembly, and including a predetermined outer diameter sized to fit within an inner diameter formed from wafer support ledges of said substrate transport container;

a self-aligning end-effector for transferring the substrate from said transport container to thermal processing along with said removable susceptor, wherein the substrate is oriented vertically above said removable susceptor; and a self-aligning substrate support assembly for supporting both said removable susceptor and the substrate in a vertical orientation during thermal processing.

38. The semiconductor substrate transfer system according to claim 37, wherein said self-aligning substrate support assembly supports a plurality of substrates and substrate susceptors during thermal processing.

39. The semiconductor substrate transfer system according to claim 38, wherein opposing support members are employed to support the substrate and said substrate susceptor.

40. The semiconductor substrate transfer system according to claim 39, wherein said opposing support members are annular in shape in a circumferential direction along a common central axis.

41. The semiconductor substrate transfer system according to claim 39, wherein said opposing support members are circular arc in shape in a circumferential direction along a common central axis.

42. The semiconductor substrate transfer system according to claim 40, wherein a flat annular extension is employed as a radiant energy emitter for a duration of any cooling phase with a circular central plane used for thermal energy collection and conveyance to said emitter.

43. The semiconductor substrate transfer system according to claim 41, wherein a flat annular extension is employed as a radiant energy emitter for a duration of any cooling phase with a circular central plane used for thermal energy collection and conveyance to said emitter.

44. The semiconductor substrate transfer system according to claim 40, wherein said annular support members include an opening at a particular point along their circumference of sufficient size to allow said self-aligning end-effector to radially translate to a position underneath the substrate.

45. The semiconductor substrate transfer system according to claim 41, wherein said circular arc support members include an opening at a particular point along their circumference of sufficient size to allow said self-aligning end-effector to radially translate to a position underneath the substrate.

46. A process for transferring a semiconductor substrate through thermal processing, comprising:

retrieving a first removable semiconductor substrate susceptor with a self-aligning end-effector in a substantially horizontal state;

aligning said first removable semiconductor substrate susceptor on said self-aligning end-effector;

retrieving a first substrate from a self-aligning substrate transport container using said self-aligning end-effector burdened with said first removable semiconductor substrate susceptor;

aligning said first substrate on said self-aligning end-effector whereas said first substrate is positioned in an imaginary vertical plane orientation directly above said first removable semiconductor substrate susceptor;

unloading said first substrate and said first removable semiconductor substrate susceptor onto a self-aligning substrate support assembly for placement in an oven for heating, wherein the imaginary vertical plane orientation is maintained;

reloading said first substrate and said removable semiconductor substrate susceptor onto said self-aligning end effector after heating;

unloading said first substrate from said self-aligning end-effector; and unloading said first removable semiconductor substrate susceptor from said self-aligning end-effector.

47. The method according to claim 46, further comprising retrieving a plurality of removable semiconductor substrate susceptors and a plurality of substrates for placement in said self-aligning substrate support assembly.

48. The method according to claim 46, further comprising aligning said first removable semiconductor substrate susceptor and said first substrate on said self-aligning end-effector by employing two different sized recesses in said self-aligning end-effector, wherein a first deeper and smaller sized recess retains said first removable semiconductor substrate susceptor, and a second larger, less deep recess and situated on top of the first recess, retains the first substrate.

49. The method according to claim 46, further comprising lifting vertically upward said self-aligning end-effector with said retained first removable semiconductor substrate susceptor, underneath said first substrate, which is supported in said self-aligning substrate transport container by support ledges.

50. The method according to claim 46, further comprising loading said self-aligning substrate support assembly by lowering vertically downward said self-aligning end-effector with said retained first removable semiconductor substrate susceptor and said first substrate, between and onto opposing support members at predetermined locations within said self-aligning substrate support assembly.

51. The method according to claim 50, further comprising using support members with a third recess sized to a depth to include said first removable semiconductor substrate susceptor, allowing said first substrate to seat directly on top.

52. The method according to claim 51, further comprising allowing a gap between said first substrate and said support members when said first removable semiconductor substrate susceptor is seated in the third recess.

53. The method according to claim 52, further comprising modifying existing substrate transport systems to include first, second and third recesses, respectively located, and at least one removable semiconductor substrate susceptor.

54. The semiconductor substrate transfer system according to claim 1, wherein said susceptor is an independent substrate support member and is thus freely removable via said end effector both from said substrate transport support and said substrate support assembly.

55. The semiconductor substrate transfer system according to claim 1 wherein said susceptor is dimensioned to contact a majority of a support surface of the substrate.

56. The semiconductor substrate transfer system according to claim 1 wherein an outer perimeter of said susceptor is sized for underlying support by a support member of said substrate support assembly while being free to vertically pass through a substrate support region defined by said substrate transport container.

57. The semiconductor substrate transfer system according to claim 56 wherein said substrate support region defined by said substrate support container includes a substrate support ledge.

58. The semiconductor substrate transfer system according to claim 1 wherein said substrate support assembly includes a radially inward extending susceptor support member which has a stepped end region with a radial interior region that is positioned for direct contact with said susceptor and a more radially external region over which the substrate extends while in support contact with said susceptor, and said interior region having a susceptor contact level and said radially external region having an upper surface and the spacing between the contact level and said upper surface being less than a thickness of the susceptor such that a gap is formed between said upper surface and an under region of a substrate supported by said susceptor.

* * * * *